US011353344B2

(12) United States Patent
Endo

(10) Patent No.: US 11,353,344 B2
(45) Date of Patent: *Jun. 7, 2022

(54) FORCE SENSOR HAVING A STRAIN BODY

(71) Applicant: NIDEC COPAL ELECTRONICS CORPORATION, Tokyo (JP)

(72) Inventor: Takayuki Endo, Sano (JP)

(73) Assignee: NIDEC COPAL ELECTRONICS CORPORATION, Tokyo (JP)

(*) Notice: Subject to any disclaimer, the term of this patent is extended or adjusted under 35 U.S.C. 154(b) by 213 days.

This patent is subject to a terminal disclaimer.

(21) Appl. No.: 16/563,205

(22) Filed: Sep. 6, 2019

(65) Prior Publication Data

US 2019/0391027 A1 Dec. 26, 2019

Related U.S. Application Data

(63) Continuation of application No. PCT/JP2017/047121, filed on Dec. 27, 2017.

(30) Foreign Application Priority Data

Mar. 8, 2017 (JP) .............................. JP2017044187

(51) Int. Cl.
*G01L 5/16* (2020.01)
*G01D 11/24* (2006.01)
(Continued)

(52) U.S. Cl.
CPC .......... *G01D 11/245* (2013.01); *B25J 13/085* (2013.01); *G01L 1/22* (2013.01);
(Continued)

(58) Field of Classification Search
CPC ............. G01L 1/22; G01L 1/26; G01L 5/226; G01L 5/16; G01L 5/1627; G01L 5/2281
See application file for complete search history.

(56) References Cited

U.S. PATENT DOCUMENTS 4,259,863 A * 4/1981 Rieck ........................ G01L 1/14
73/862.041
5,945,606 A * 8/1999 Tokunaga ................ G01K 1/14
73/756

(Continued)

FOREIGN PATENT DOCUMENTS

CN 102879131 A 1/2013
CN 105723198 6/2016
(Continued)

OTHER PUBLICATIONS

International Search Report for International Application PCT/JP2017/047121, dated Jan. 30, 2018.
(Continued)

*Primary Examiner* — Tran M. Tran
(74) *Attorney, Agent, or Firm* — Burris Law, PLLC

(57) ABSTRACT

In a force sensor according to one embodiment, a main body is cylindrical. A cylindrical movable body is movable with respect to the main body and includes at least three circular openings in the outer circumference thereof. A strain body is fixed to the main body and the movable body and is deformable according to the movement of the movable body. Strain sensors are provided on the strain body. A first stopper is arranged inside each of the openings and includes a first outer circumferential surface including a first outer diameter less than a diameter of the opening. Sealing members are configured to cover at least the openings and a movable part between the main body and the movable body.

12 Claims, 15 Drawing Sheets

(51) Int. Cl.
*B25J 13/08* (2006.01)
*G01L 1/22* (2006.01)
*G01L 1/26* (2006.01)
*G01L 3/10* (2006.01)
*G01L 5/161* (2020.01)

(52) U.S. Cl.
CPC ............... *G01L 1/26* (2013.01); *G01L 3/108* (2013.01); *G01L 5/161* (2013.01)

(56) References Cited

U.S. PATENT DOCUMENTS

| | | | | |
|---|---|---|---|---|
| 6,298,730 | B1* | 10/2001 | Yamagishi | G01L 19/0084 73/723 |
| 6,871,552 | B2* | 3/2005 | Liu | G01L 1/22 73/862.041 |
| 7,059,197 | B2* | 6/2006 | Son | B62D 57/032 73/818 |
| 7,570,065 | B2* | 8/2009 | Harish | G01G 7/06 324/661 |
| 7,922,157 | B2* | 4/2011 | Hayashi | F16C 27/02 267/141.2 |
| 8,726,740 | B1* | 5/2014 | Mekid | B23Q 17/0966 73/862.041 |
| 9,215,089 | B2* | 12/2015 | Murayama | G01L 5/228 |
| 9,377,372 | B2* | 6/2016 | Ogawa | G01L 1/26 |
| 9,481,089 | B2* | 11/2016 | Matsuzawa | B25J 9/1694 |
| 9,638,554 | B2* | 5/2017 | Takahama | G01D 11/30 |
| 9,869,597 | B1* | 1/2018 | Reich | G01L 1/16 |
| 10,239,213 | B1* | 3/2019 | Reich | B25J 9/1638 |
| 10,408,670 | B2* | 9/2019 | Holcomb | G01G 3/1414 |
| 10,527,508 | B2* | 1/2020 | Berme | G01L 1/2281 |
| 10,527,509 | B2* | 1/2020 | Mokhbery | G01L 5/162 |
| 10,578,500 | B2* | 3/2020 | Kawai | B25J 13/085 |
| 10,647,007 | B2* | 5/2020 | Cordoba | A61B 1/00149 |
| 2012/0001374 | A1* | 1/2012 | Iseki | F16F 3/093 267/141.2 |
| 2013/0340537 | A1 | 12/2013 | Friewald et al. | |
| 2015/0266184 | A1* | 9/2015 | Arakawa | G01L 5/167 700/258 |

FOREIGN PATENT DOCUMENTS

| | | |
|---|---|---|
| CN | 102879131 B | 9/2016 |
| CN | 105938030 | 9/2016 |
| CN | 106197780 | 12/2016 |
| CN | 106197816 | 12/2016 |
| CN | 110383023 | 10/2019 |
| DE | 3782898 | 5/1993 |
| JP | S61-193344 | 12/1986 |
| JP | S64-69927 | 3/1989 |
| JP | S6468630 | 3/1989 |
| JP | H01189534 | 7/1989 |
| JP | H0629804 | 4/1994 |
| JP | H6-043937 | 6/1994 |
| JP | 2010008343 | 1/2010 |
| JP | 2014119347 | 6/2014 |
| JP | 2014169864 | 9/2014 |

OTHER PUBLICATIONS

Extended European Search Report issued in corresponding EP Application 17899429.9, dated Dec. 3, 2020.
Office Action issued in corresponding CN Application No. 201780087831.9, dated Sep. 18, 2020.
Song, et al., Thin-Walled Cylinder Structure Based Optical Fiber Grating Gas Pressure Sensor, Shangdong Science, Feb. 28, 2015, vol. 28(1), pp. 51-55, China Academic Journal Electronic Publishing House, 1994-2019.

* cited by examiner

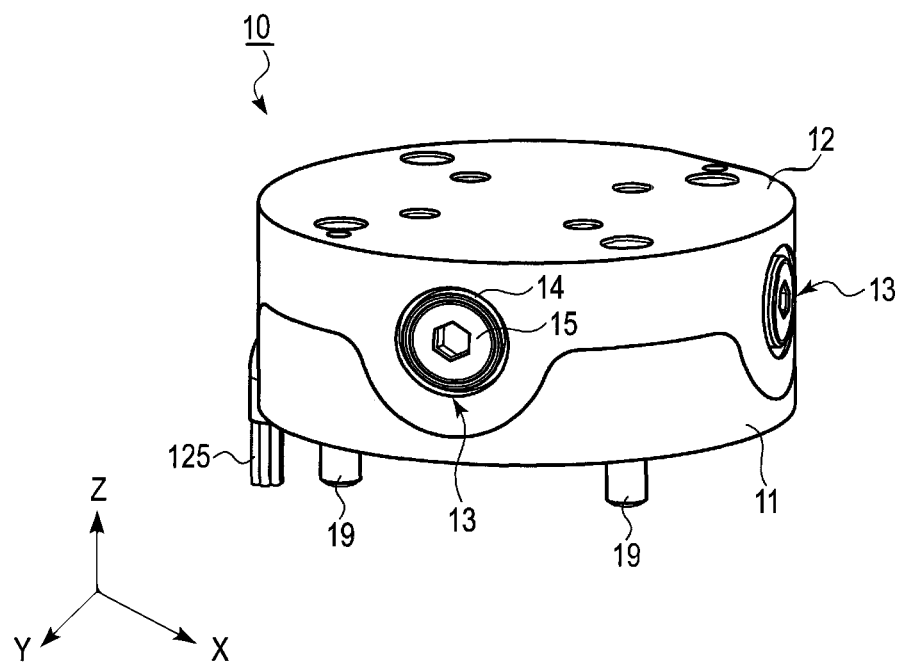
F I G. 1
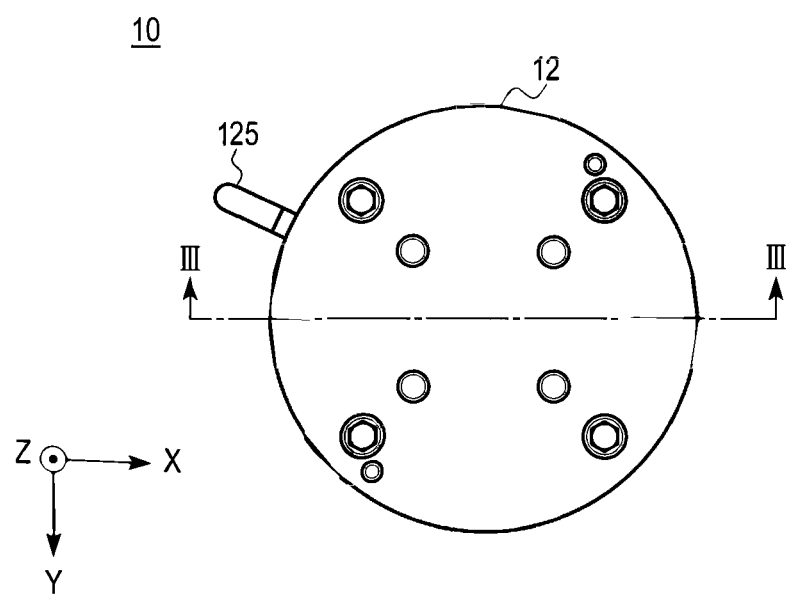
F I G. 2

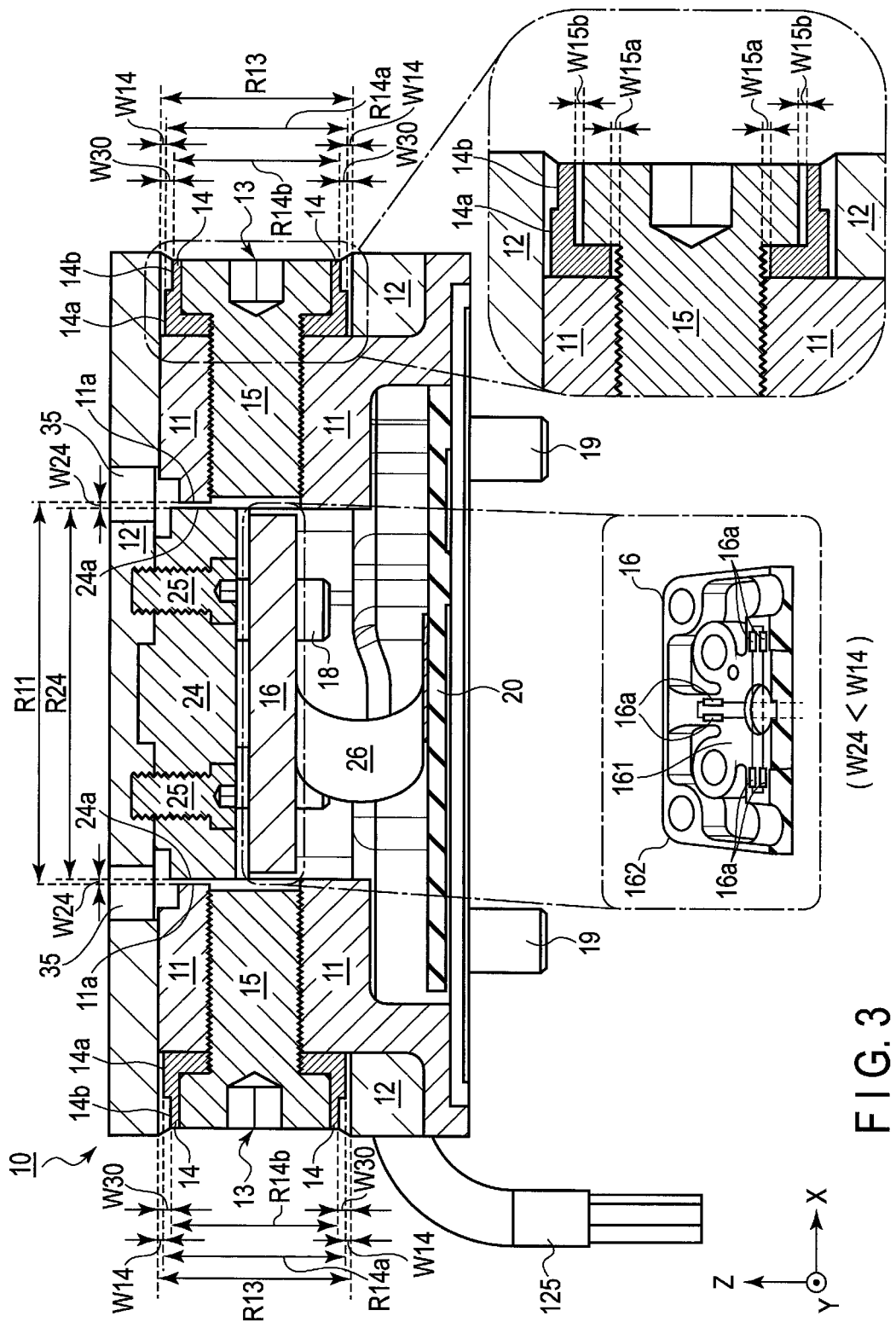
F I G. 3

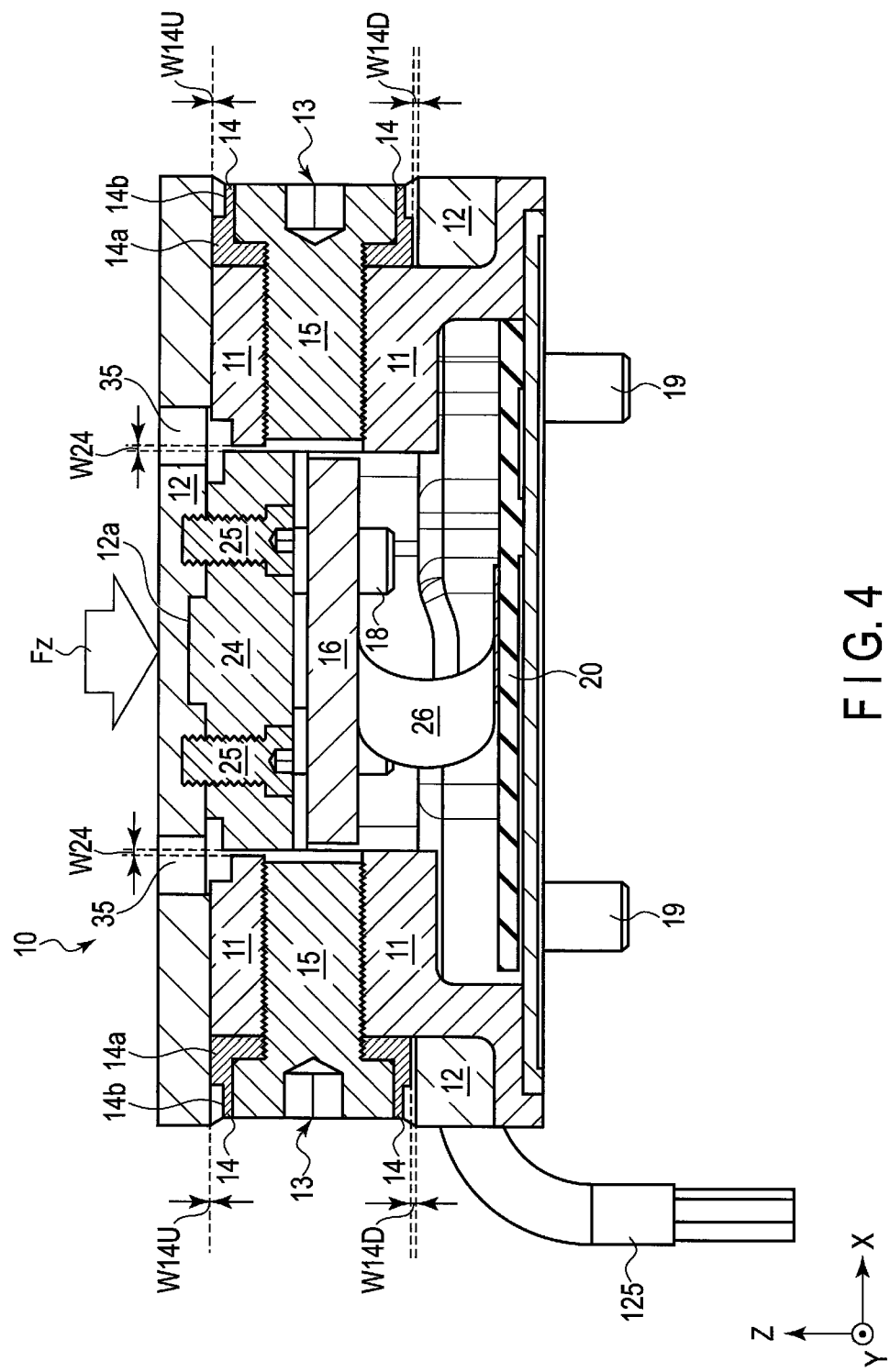
F I G. 4

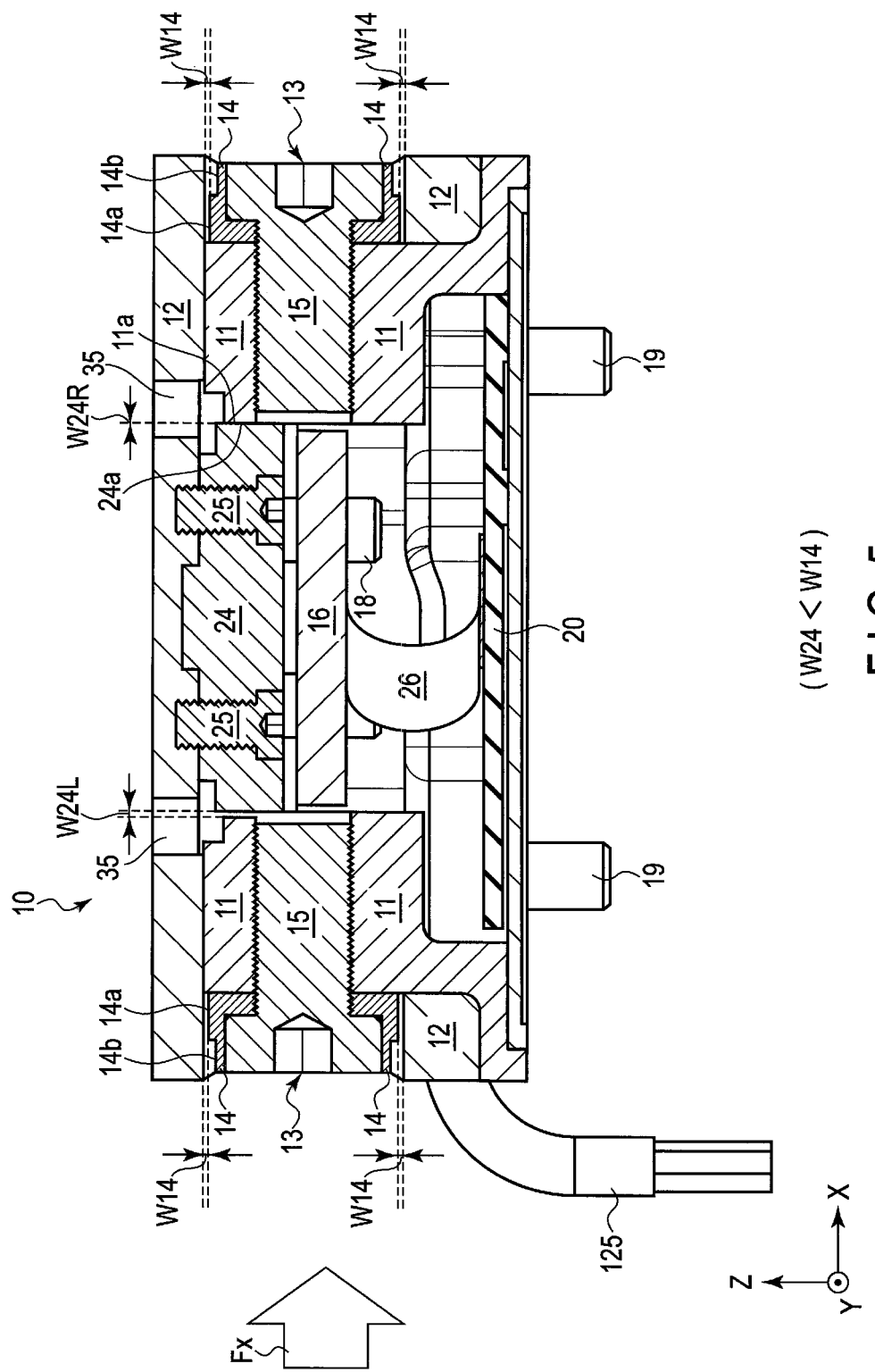
F I G. 5  (W24 < W14)

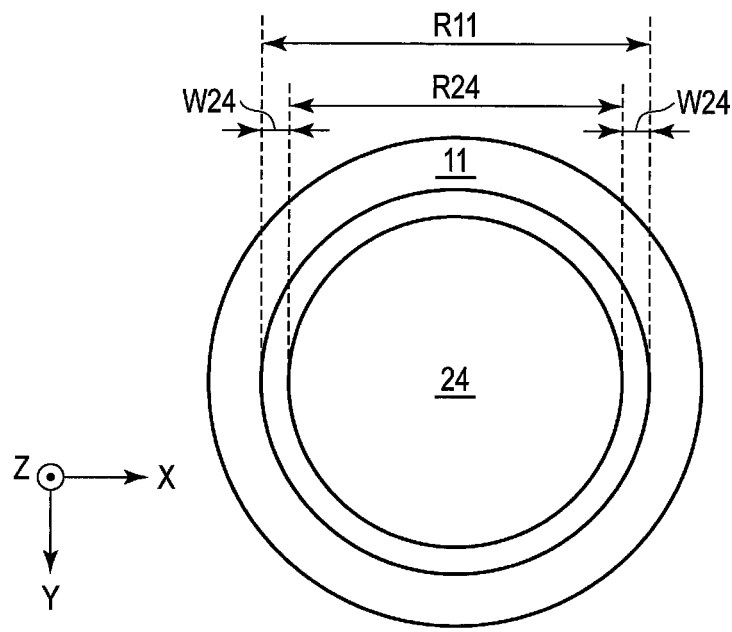
F I G. 6A
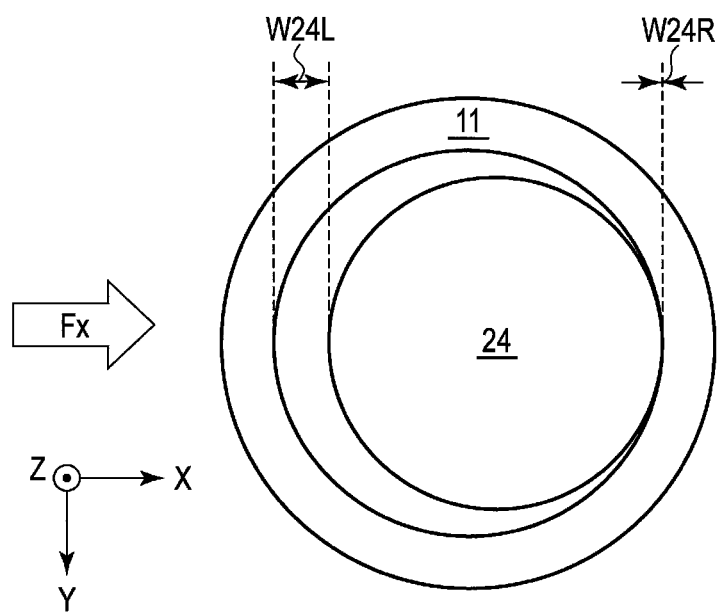
F I G. 6B

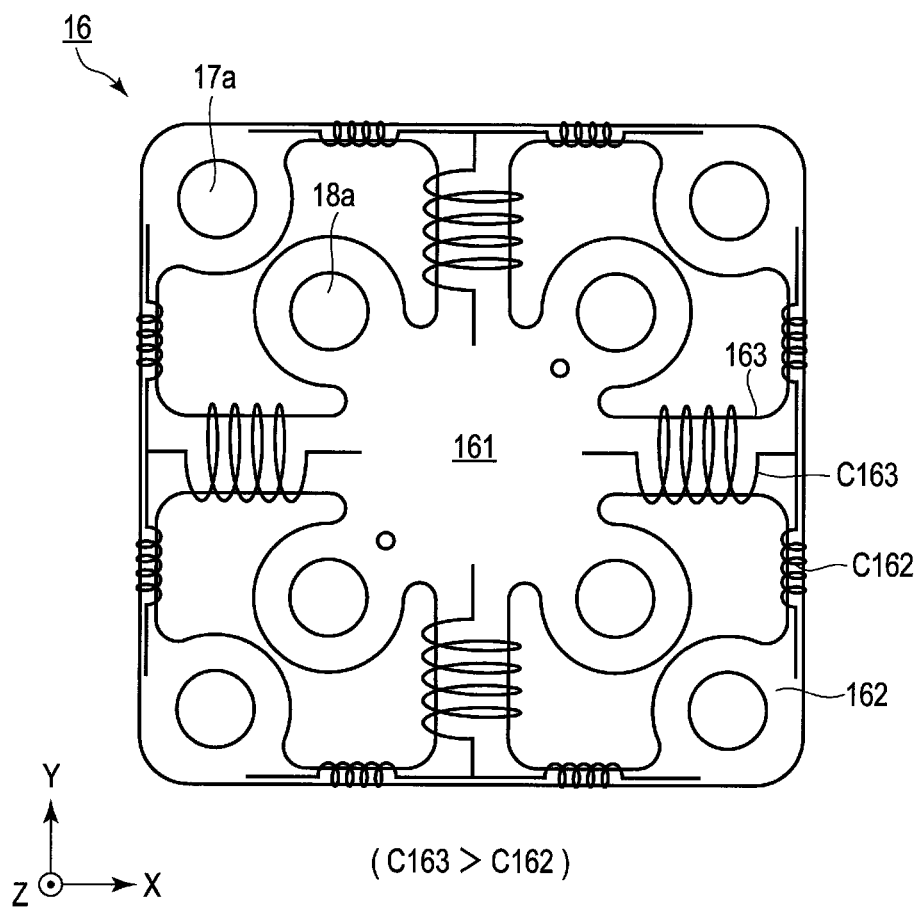
F I G. 11

FIG. 12 (W24 < W14)

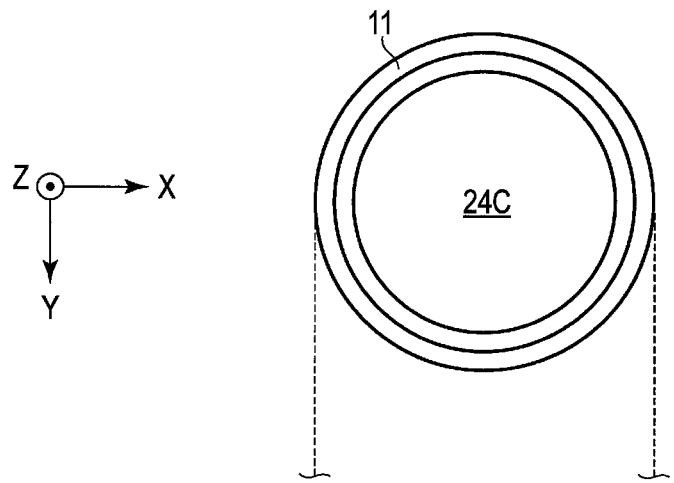
F I G. 16A
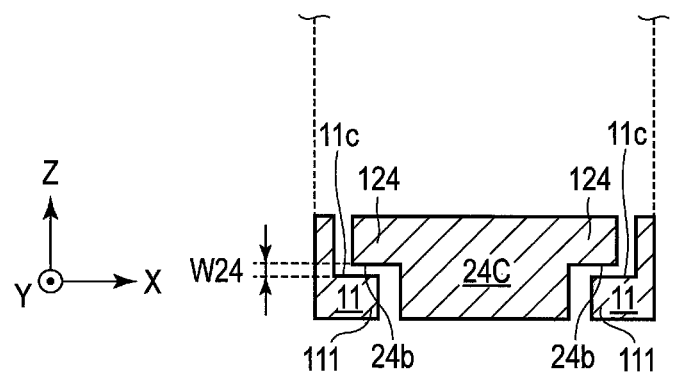
F I G. 16B

FORCE SENSOR HAVING A STRAIN BODY

CROSS-REFERENCE TO RELATED APPLICATIONS

This application is a continuation of International Application No. PCT/JP2017/047121, filed on Dec. 27, 2017, which claims priority to and the benefit of Japanese Patent Application No. 2017-044187, filed on Mar. 8, 2017. The disclosures of the above applications are incorporated herein by reference.

FIELD

The present disclosure relates to a hex-axial force sensor to be used for, for example, a robot arm or the like.

BACKGROUND

A force sensor used for, for example, a robot arm or the like and configured to detect external force and torque associated with the X-, Y-, and Z-axis directions is known (see, for example, Patent Literature 1 (JP 2010-008343 A) and Patent Literature 2 (JP H06-043937 B2)).

In the force sensor of this kind, external force applied to a movable part serving as a force-receiving body is transmitted to, for example, a strain body, and deformation of the strain body is converted into an electrical signal by a strain sensor (strain gage), whereby the force or torque is detected.

SUMMARY

When the force sensor is to be applied to, for example, a robot arm or the like, the actual work site is under such an environment that liquid such as oil, water or the like is used and dust also scatters therein, and hence liquid and dust may enter the inside of the force sensor through the gap between the main body and movable body thereof.

The present invention has been contrived in consideration of these circumstances, and provides a force sensor capable of preventing liquid and dust from entering the inside through the gap between the main body and movable body, and improving the reliability.

A force sensor according to one embodiment comprises a cylindrical main body, a cylindrical movable body movable with respect to the main body and including at least three circular openings in the outer circumference thereof, a strain body fixed to the main body and the movable body and deformable according to the movement of the movable body, strain sensors provided on the strain body, a first stopper arranged inside each of the openings and including a first outer circumferential surface including a first outer diameter less than a diameter of the opening, and sealing members configured to cover at least the openings and a movable part between the main body and the movable body.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a perspective view showing a force sensor according to a first embodiment.

FIG. 2 is a plan view showing the force sensor according to the first embodiment.

FIG. 3 is a cross-sectional view showing the force sensor along line III-III of FIG. 2.

FIG. 4 is a cross-sectional view shown for explaining an operation for detecting external force in the Z-axis direction applied to the force sensor.

FIG. 5 is a cross-sectional view shown for explaining an operation for detecting external force in the X-axis direction applied to the force sensor.

FIG. 6A is a view showing an operation of a second stopper, and is a plan view schematically showing an initial state.

FIG. 6B is a plan view schematically showing an external force detecting operation of the second stopper in the X-axis direction.

FIG. 11 is a plan view showing a strain body of the force sensor.

FIG. 16A is a plan view showing a relationship between a second stopper and main body according to a modification example 2.

FIG. 16B is a cross-sectional view of FIG. 16A.

DETAILED DESCRIPTION

Figure 7:
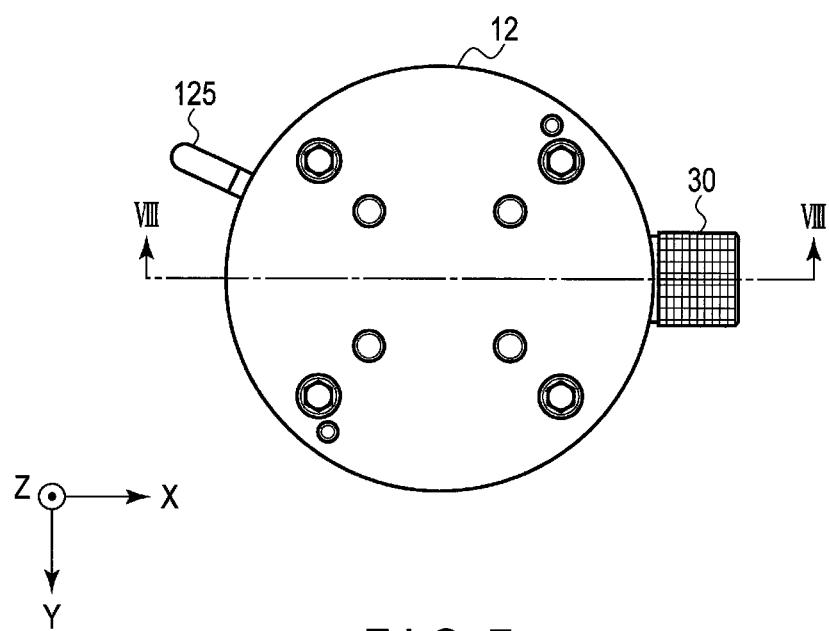
FIG. 7 is a plan view showing the force sensor fitted with a jig for a first stopper.

Embodiments of the present invention will be described below with reference to the accompanying drawings. It should be noted that in the following descriptions, substantially identical functions and elements are denoted by identical reference numbers, and descriptions are given as the need arises. Further, the drawings are schematic views, and a relationship between the thickness and planar dimension, ratios between layers and the like may differ from reality in some cases.

First Embodiment

[Configuration]
Overall Configuration

FIG. 1 is a perspective view showing a force sensor according to a first embodiment. FIG. 2 is a plan view showing the force sensor according to the first embodiment. The force sensor 10 according to the first embodiment is used for, for example, a robot arm or the like and detects force in the X-, Y-, and Z-axis directions and torque. A hex-axial force sensor will be described as an example.

As shown in FIG. 1 and FIG. 2, the force sensor 10 is provided with a cylindrical main body 11 and cylindrical movable body 12 capable of moving with respect to the main body 11. The main body 11 is fixed to, for example, a main body or the like of a robot arm not shown. The movable body 12 functions as a mounting plate or the like configured to mount a hand part of the robot arm not shown on a top surface thereof.

The main body 11 is a base member of the force sensor 10, and movable body 12 is attached to the main body 11 in such a manner as to be able to move in the hex-axial directions (X-axis direction, Y-axis direction, Z-axis direction, and directions around these axes) with respect to the main body 11 with a strain body capable of elastic deformation interposed between itself and the main body 11.

In the circumferential surface of the movable body 12, for example, four circular openings 13 are provided at equal intervals. That is, the openings 13 are arranged in the X-axis direction and Y-axis direction. The number of the openings 13 is not limited to four, and it is sufficient if the number is three or more. Inside each of the openings 13, a first stopper 14 is arranged, and each first stopper 14 is fixed to the main body 11 by means of a bolt 15.

The first stopper 14 is configured to limit the moving range of the movable body 12 with respect to the torque in the X-axis direction, torque in the Y-axis direction, and force and torque in the Z-axis direction. The outermost circumferential part of the first stopper 14 includes, as will be described later, a first side face which can be brought into contact with the inner face of the opening 13. That is, when the movable body 12 is moved by the force and torque associated with the aforementioned axis directions, and when, concomitantly with this, the strain body is deformed, the inner face of the opening 13 of the movable body 12 is brought into contact with the first side face, whereby the first stopper 14 functions as a protection mechanism configured to prevent excessive deformation of the strain body from occurring.

To the side face of the main body 11, wiring 125 configured to transmit a detection signal to the outside is drawn out. The wiring 125 is electrically connected to a circuit board to be described later.

Cross-Sectional Configuration

FIG. 3 is a cross-sectional view showing the force sensor 10 along line III-III of FIG. 2.

As shown in FIG. 3, at a central part of the inside of the force sensor 10, a strain body 16 is arranged. A central section 161 of the strain body 16 is attached to the movable body 12 by means of bolts 18 through a second stopper 24, and outer peripheral section 162 surrounding the central section 161 of the strain body 16 is attached to the main body 11 by means of bolts not shown. The surface of the strain body 16 is arranged in parallel with a surface formed by the X- and Y-axes, and line passing through the center of the strain body 16 at right angles is made coincident with the Z-axis. Upon application of external force, the movable body 12 is moved and the strain body 16 is displaced. For example, at a plurality of connection sections connecting the central section of the strain body 16 and the outer peripheral section thereof to each other, a plurality of strain sensors 16a constituting a bridge circuit are provided, and the displacement of the strain body 16 is electrically detected by the strain sensors 16a. The arrangement of the strain sensors 16a is not limited to this, and the strain sensors 16a may also be provided at the central section 161 of the strain body 16.

Inside the main body 11, a circuit board 20 is provided in opposition to the strain body 16. The circuit board 20 is fixed to the main body 11, and is electrically connected to the plurality of strain sensors 16a provided on the strain body 16.

The strain sensors 16a are arranged at predetermined positions on the surfaces of the plurality of connection sections of the strain body 16. The displacement at each of the places of the strain body 16 is measured by each strain sensor 16a, whereby force and torque in the hex-axial directions are detected. It should be noted that the configuration and arrangement of the strain sensors 16a are not limited to the above, and can appropriately be changed.

On the surface of the strain body 16, Flexible Printed Circuits (FPC) 26 configured to electrically connect the strain sensors 16a and the circuit board 20 to each other are provided. The FPC 26 are provided with an insulating flexible film and predetermined electrical circuits formed on the film, and are configured to be able to be freely bent according to the movement of the movable body 12.

The first stopper 14 includes the aforementioned first side face (outer circumferential surface) 14a and second side face (outer circumferential surface) 14b. The first side face 14a has a first outer diameter R14a less than the diameter R13 of the opening 13 of the movable body 12. The second side face 14b has a second outer diameter R14b less than the first outer diameter R14a, and is positioned on the outer side of the first side face 14a inside the opening 13. Accordingly, a distance W14 between the first side face 14a and inner face of the opening 13 is configured in such a manner as to become less than a distance W30 between the second face 14b and inner face of the opening 13 (W14<W30). The distance W30 is, for example, about several millimeters.

It should be noted that between the side faces of the movable body 12 and main body 11 too, a gap corresponding to the distance W30 is provided, and thus the movable body 12 is made movable with respect to the main body 11. Further, in the cross-sectional view, although the main body 11 and movable body 12 are schematically shown as if the main body 11 and movable body 12 are in contact with each other, actually between the entire counter parts of the main body 11 and movable body 12 (also at the inner parts other than the side faces), a gap of such a degree that operations are not hindered (for example, about 1 mm) is provided. Hereinafter, the illustration of the gap is omitted.

Here, the distance (clearance) W14 between the first side face 14a and inner face of the opening 13 is, for example, about 100 μm±20 μm, and hence is very narrow. Furthermore, in order to prevent the strain body 16 from being damaged when the movable body 12 is moved, this distance W14 needs to be managed with an extremely high degree of accuracy.

As indicated by the enlarged part of FIG. 3 surrounded by a dot line, actually, between the internal face of the first stopper 14 corresponding to the first side face 14a and thread face of the bolt 15, a gap indicated by a distance W15a is provided. Further, between the inner face of the first stopper 14 corresponding to the first side face 14a and second side face 14b and the side face of the head of the bolt 15 too, a gap having a distance W15b is provided. Each of the distances W15a and W15b is, for example, about 0.2 mm. It should be noted that in the description to be given hereinafter, illustrations of these gaps are omitted.

In this embodiment, in the state where a shim serving as a jig for adjustment and including an insertion section having a thickness substantially identical to the distance W30 is inserted between the second side face 14b of the first stopper 14 and inner face of the opening 13, the first stopper 14 is fixed to the main body 11 by means of the fixing bolt 15. By carrying out adjustment in this manner, the first stopper 14 can be moved by a distance corresponding to the distance W15a or W15b of each of the aforementioned gaps, and hence it is possible to manage the distance (clearance) W14 between the inner face of the opening 13 of the movable body 12 and first side face 14a of the first stopper 14 with a high degree of accuracy. Details of the above will be described later.

Furthermore, above the strain body 16 and inside the inner circumferential surface 11a of the main body 11, a second stopper 24 is provided. The second stopper 24 has an outer diameter R24 less than the diameter R11 of the inner circumferential surface 11a. Accordingly, between the inner circumferential surface 11a of the main body 11 and outer circumferential surface of the second stopper 24, a gap having a distance W24 is arranged. The second stopper 24 has a cylindrical shape, the center thereof is coincident with the center of the main body 11, and the axis vertically passing the center thereof is coincident with the Z-axis. Further, the second stopper 24 is fixed to the movable body 12 by means of bolts 25.

The second stopper 24 is configured to limit the operating range of the movable body 12 with respect to the force in the X-axis direction and force in the Y-axis direction, and is configured in such a manner that the outer circumferential surface 24a of the second stopper 24 can be brought into contact with the inner circumferential surface 11a of the main body 11. In other words, the second stopper 24 is configured to limit the operating range of the movable body 12 with respect to the force from the direction other than the force from the direction protection from which is provided by the first stopper 14.

In the configuration described above, when the force in the X-axis direction and force in the Y-axis direction are applied to the force sensor 10 and the strain body is deformed concomitantly with the movement of the movable body 12, the outer circumferential surface 24a of the second stopper 24 comes into contact with the inner circumferential surface 11a of the main body 11 earlier than the first stopper 14 because the distance W24 between the second stopper 24 and main body 11 is less than the distance W14 between the opening 13 and first stopper 14 (W24<W14). As described above, the second stopper 24 functions as a protection mechanism configured to prevent excessive deformation of the strain body 16 resulting from the aforementioned force in each axis direction from occurring. Details of the above will be described later.

[Detection Operation]

(Regarding Fz, Mx, My, and Mz)

FIG. 4 is a cross-sectional view for explaining an external force detection operation in the Z-axis direction. With reference to FIG. 4, a case where external force (load) Fz applied to the approximately central part of the movable body 12 in the Z-axis direction is to be detected will be described below.

As shown in FIG. 4, when the external force Fz is applied to the approximately central part of the movable body 12, the movable body 12 is moved by the external force Fz downwardly in the Z-axis direction. The main body 11 is fixed and is not moved even by the external force Fz, and hence the movable body 12 is downwardly moved until the inner surface of the opening 13 on the upper side comes into contact with the first side face 14a of the first stopper 14. Owing to the movement of the movable body 12, the upper gap (distance W14U) becomes substantially zero, and lower gap (distance W14D) is increased to about twice the distance as compared with the distance at the time before the movement.

Owing to the movement of the movable body 12, the strain body 16 is deformed. However, the deformation of the strain body 16 is limited to a predetermined range by the first stopper 14, and hence the strain body 16 is protected from destruction resulting from excessive external force. The deformation of the strain body 16 is detected by the strain sensor 16a, and is then converted into a detection signal as an electrical signal. The detection signal is transmitted to the outside through the circuit board 20 and wiring 125, whereby the external force Fz is detected.

Thereafter, when the application of the external force Fz to the movable body 12 is released, the strain body 16 is restored to the original shape by the elastic deformation.

It should be noted that in the above, although the detection operation of the external force in the Z-axis direction has been described, the operation of detecting torque around each of the X-, Y-, and Z-axis directions is substantially identical to the detection operation of the external force described above.

(Regarding Fx and Fy)

FIG. 5 is a cross-sectional view for explaining an external force detecting operation in the X-axis direction. FIG. 6A is a view showing an initial state, and FIG. 6B is a plan view schematically showing an external force detecting operation at the time of the second stopper function in the X-axis direction. With reference to FIG. 5, FIG. 6A, and FIG. 6B, a case where the external force (load) Fx applied to the side face of the movable body 12 in the X-axis direction is to be detected will be described below.

As shown in FIG. 5 and FIG. 6B, when the external force Fx is applied to the side face of the movable body 12 in the X-axis direction, the movable body 12 is moved to the right side of FIG. 6B in the X-axis direction by the external force Fx. The main body 11 is fixed and is not moved by the external force Fx, and hence the movable body 12 is moved until the outer circumferential surface 24aR of the second stopper 24 on the right side comes into contact with the inner circumferential surface 11a of the main body 11. The distance W24 between the main body 11 and second stopper 24 is less than the distance W14 between the opening 13 and first stopper 14 (W24<W14), and hence the outer circumferential surface 24aR of the second stopper 24 comes into contact with the inner circumferential surface 11a of the main body 11 earlier than the first stopper 14. By the movement described above, the gap (distance W24R) on the right side of the second stopper 24 becomes substantially zero, and the gap (distance W24L) on the left side is increased to about twice the distance as compared with the distance at the time before the movement.

By the movement of the movable body 12, the strain body 16 is deformed. However, the deformation of the strain body 16 is limited to the predetermined range by the second stopper 24, and hence the strain body 16 is protected from destruction resulting from excessive external force. The deformation of the strain body 16 is detected by the strain sensor 16a, is then converted into a detection signal as an electrical signal, and the detection signal is transmitted to the outside through the circuit board 20 and wiring 125, whereby the external force Fx can be detected.

Thereafter, when the application of the external force Fx to the movable body 12 is released, the strain body 16 is restored to the original shape by the elastic deformation.

It should be noted that in the above, although the operation of detecting the external force in the X-axis direction has been described, the operation of detecting the external force in the Y-axis direction is substantially identical to the detection operation of the external force described above.

[Adjustment of Clearance]

(Adjustment of Clearance W14 of First Stopper)

Figure 8:
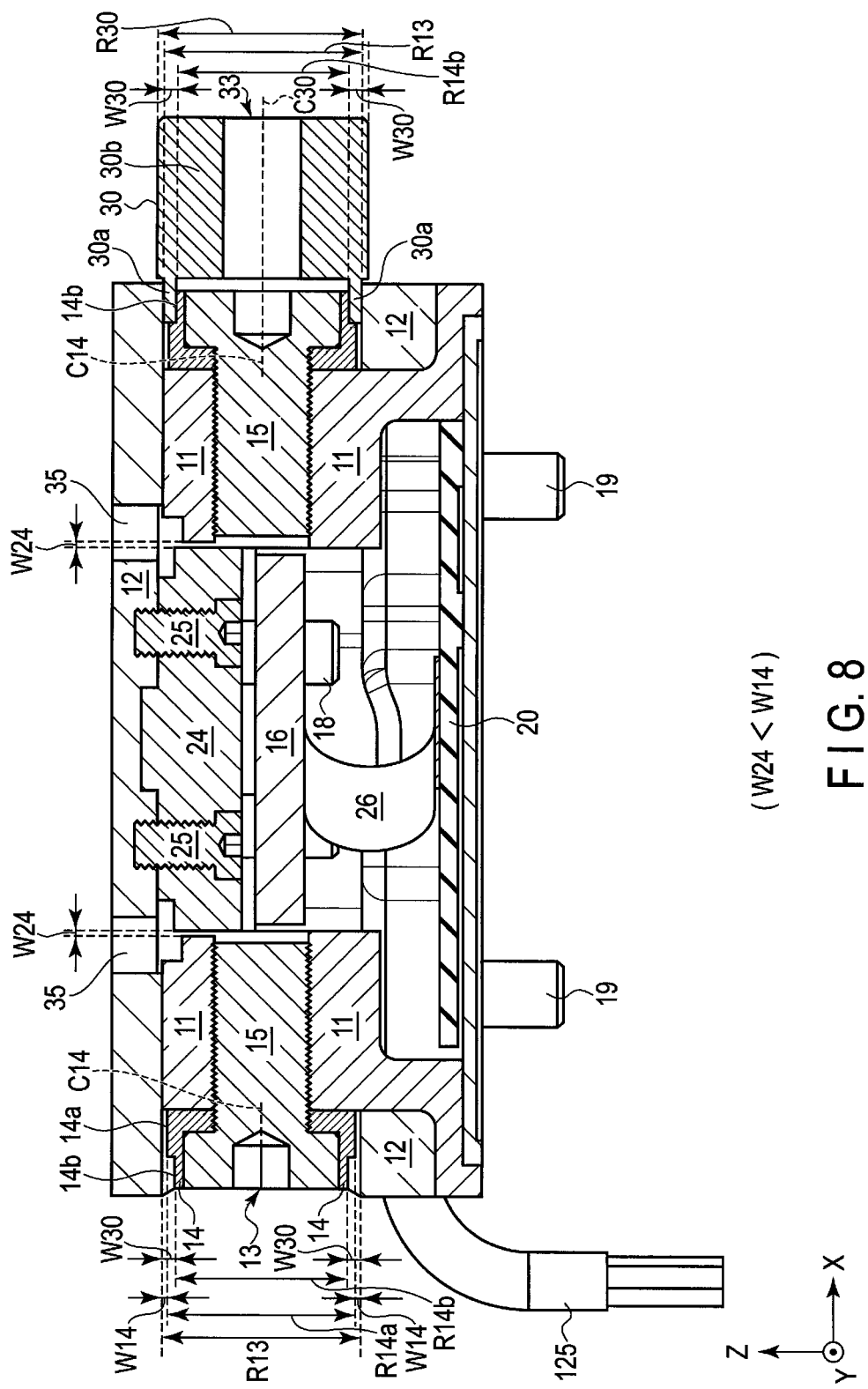
FIG. 8 is a cross-sectional view showing the force sensor along line VIII-VIII of FIG. 7.

FIG. 7 is a plan view showing the force sensor fitted with a jig for the first stopper. FIG. 8 is a view showing the cross section along line VIII-VIII of FIG. 7.

As shown in FIG. 7 and FIG. 8, an adjustment of the clearance W14 of the first stopper 14 is carried out by fitting a shim 30 into the opening 13. Although FIG. 7 and FIG. 8 show the case where the shim 30 is fitted into one opening 13, it is desirable that the adjustment be carried out in the state where shims 30 are fitted into all the four openings 13. In this case, it is possible to further improve the accuracy of the adjustment and shorten the time for the adjustment work.

As shown in FIG. 8, the shim 30 has a cylindrical insertion section 30a, knob section 30b, and opening 33.

The insertion section 30a has an outer diameter R13 approximately equal to the diameter of the opening 13 of the movable body 12, and the thickness of the insertion section 30a is set to a thickness substantially identical to the distance W30 between the second side face 14b of the first stopper 14 and inner face of the opening 13.

The knob section 30b has an outer diameter R30 greater than the diameter R13 of the opening 13.

The opening 33 is formed in such a manner that it is possible to insert a hexagonal wrench (not shown) to be fitted into a hexagon socket provided in the head of the bolt 15 into the opening 33 while penetrating the knob section 30b.

As shown in FIG. 8, in the state where the bolt 15 is loosened, the insertion section 30a of the shim 30 is inserted between the second side face 14b of the first stopper 14 and inner face of the opening 13. The outer diameter of the insertion section 30a is substantially equal to the diameter R13 of the opening 13, and inner diameter of the insertion section 30a is substantially equal to the second outer diameter R14b of the second side face 14b of the first stopper 14. Accordingly, in the state where the insertion section 30a of the shim 30 is inserted into the opening 13, the central axis C30 of the shim 30 and central axis C14 of the first stopper 14 are made coincident with each other, and concentric circles are obtained. That is, in this state, the first stopper 14 is movable by the distance W15a or 15b of the gap shown in FIG. 3 by enlarging, and hence the distance W14 between the first side face 14a of the first stopper 14 and inner face of the opening 13 is accurately set.

In this state, the hexagonal wrench (not shown) is inserted into the opening 33 of the shim 30, and the bolt 15 is tightened by using the wrench, whereby the first stopper 14 is fixed to the main body 11.

As described above, by inserting the insertion section 30a having a thickness corresponding to the distance W30 between the second side face 14b of the first stopper 14 and opening 13, it is possible to accurately manage the clearance which is the distance W14 between the first side face 14a of the first stopper 14 and inner face of the opening 13.

(Adjustment of Clearance W24 of Second Stopper)

Figure 9:
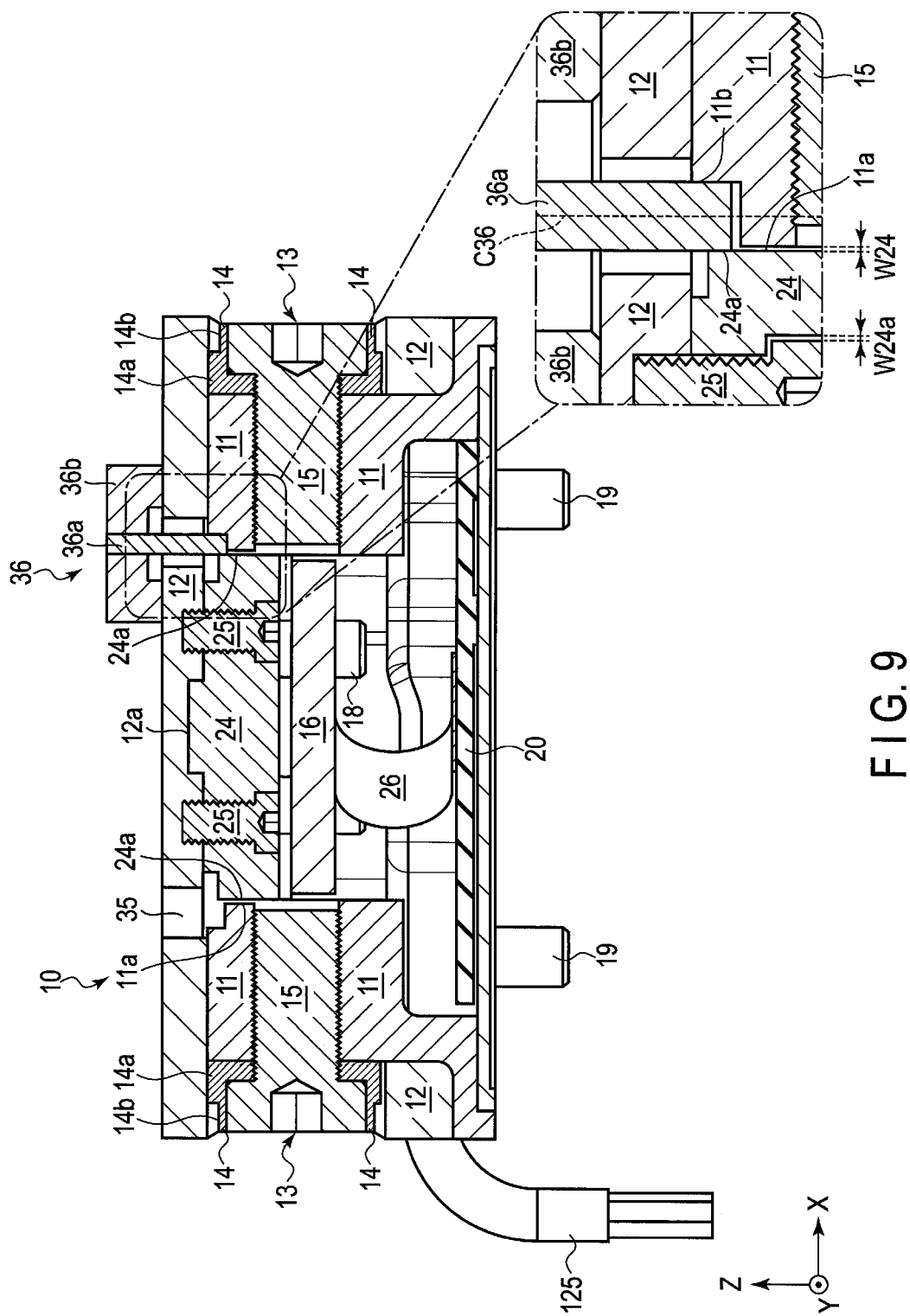
FIG. 9 is a cross-sectional view showing the force sensor fitted with a jig for the second stopper.

FIG. 9 is a cross-sectional view showing the force sensor fitted with a jig for the second stopper. As shown in FIG. 9, an adjustment of the clearance W24 of the second stopper 24 is carried out by fitting a shim 36 into an opening 35 provided in the movable body 12. It should be noted that in FIG. 9, although the case where the shim 36 is fitted into one opening 35 is shown, it is desirable that the adjustment be carried out in the state where shims 36 are fitted into all the four openings 35 provided in the movable body 12. In this case, it is possible to further improve the accuracy of the adjustment and shorten the time for the adjustment work.

Here, as shown in FIG. 9 in which the insertion section is shown by enlarging, the main body 11 includes a step section having an inner circumferential surface 11b along the Z-axis. That is, the inside of the main body 11 includes the inner circumferential surface (second inner circumferential surface) 11b forming a diameter greater than the diameter R11 formed by the inner circumferential surface (first inner circumferential surface) 11a with which the side surface 24a of the second stopper 24 is to be in contact.

The shim 36 includes a pin 36a serving as an insertion section, and cylindrical knob section 36b. The pin 36a has a distance between the outer circumferential surface 24a of the second stopper 24 and inner circumferential surface 11b of the main body 11 as the diameter thereof.

In the configuration described above, in the state where the bolts 25 are loosened, the pin 36a of the shim 36 is inserted from the opening 35 to between the outer circumferential surface 24a of the second stopper 24 and inner circumferential surface 11b of the main body 11. The outer diameter of the pin 36a is substantially equal to the distance between the outer circumferential surface 24a of the second stopper 24 and inner circumferential surface 11b of the main body 11, and hence the central axis C36 of the shim 36, and central axes of the circles respectively having diameters of the outer circumferential surface 24a and inner circumferential surface 11b as their diameters are coincident with each other, and concentric circles are formed. The second stopper 24 is movable by a distance corresponding to the distance W24a of the gap, and hence the distance W24 between the outer circumferential surface 24a of the second stopper 24 and first inner circumferential surface 11a of the main body 11 is accurately set.

In this state, a hexagonal wrench (not shown) is used to tightly screw the bolts 25 into the movable body 12, whereby the second stopper 24 is fixed to the movable body 12.

As described above, by inserting the pin 36a between the outer circumferential surface 24a of the second stopper 24 and second inner circumferential surface 11b of the main body 11, it is possible to accurately manage the clearance which is the distance W24 between the outer circumferential surface 24a of the second stopper 24 and first inner circumferential surface 11a of the main body 11.

[Function and Advantage]

For example, when the stiffness (spring constant) of the strain body differs depending on the axis directions, in the axis direction in which the stiffness is higher, the operating point of the protection mechanism is shifted to the high-load side as compared with the axis direction in which the stiffness is lower, and hence the safety is lowered and there is a possibility of the strain body being broken. In the case of the strain body 16 according to this embodiment, it is known that there is about a six-fold difference between the stiffness of the strain body 16 based on force in the X-axis direction and Y-axis direction and stiffness of the strain body 16 based on torque around each of the X-, Y-, and Z-axis directions.

Thus, the force sensor 10 according to the first embodiment is provided with the second stopper 24, the second stopper 24 is separate from the first inner circumferential surface 11*a* of the main body 11 by the distance W24, has the outer circumferential surface 24*a* of the outer diameter R24 less than the diameter R11 of the first inner circumferential surface 11*a*, and functions with respect to only force in the X-axis direction and Y-axis direction. The second stopper 24 is configured in such a manner as to limit the operating range of the movable body 12 with respect to the force in the X-axis direction and Y-axis direction, and is further configured in such a manner that the outer circumferential surface 24*a* of the second stopper 24 can come into contact with the inner circumferential surface 11*a* of the main body 11 (FIG. 3).

In the configuration described above, when the force in the X-axis direction is applied to the force sensor 10, the outer circumferential surface 24*a* of the second stopper 24 comes into contact with the inner circumferential surface 11*a* of the main body 11 earlier than the first stopper 14 because the distance W24 between the outer circumferential surface 24*a* of the second stopper 24 and first inner circumferential surface 11*a* of the main body 11 is less than the distance W14 between the first side face 14*a* of the first stopper 14 and opening 13 (W24<W14). Accordingly, it is possible to prevent an excessive deformation of the strain body 16 resulting from the force in the X-axis direction and Y-axis direction from occurring (FIG. 5 and FIG. 6).

Accordingly, even when, as in the case of the strain body 16 of this embodiment, there is about a six-fold difference between the stiffness of the strain body 16 based on the force in the X-axis direction and Y-axis direction and stiffness of the strain body 16 based on the torque associated with each of the X-, Y-, and Z-axis directions, it is possible to prevent an excessive deformation of the strain body 16 in the X-axis direction and Y-axis direction from occurring. Therefore, it is possible to improve the safety of the strain body 16, and improve the reliability.

Moreover, the clearance W24 of the second stopper 24 is accurately managed by utilizing the shim 36. That is, the outer diameter of the pin 36*a* of the shim 36 is substantially equal to the distance between the outer circumferential surface 24*a* of the second stopper 24 and second inner circumferential surface 11*b* of the main body 11, and hence it is possible to make the center of a circle having the diameter of the outer circumferential surface 24*a* as the diameter thereof and center of a circle having the diameter of the inner circumferential surface 11*b* as the diameter thereof coincident with each other by using the shim 36. In this state, the bolts 25 are tightened, whereby it is possible to attach the second stopper 24 to the movable body 12 in the state where the clearance W24 is accurately managed (FIG. 9).

Further, the non-uniformity of the strain body 16 in the stiffness can be allowed, and hence it is possible to realize downsizing and reduction in thickness of the strain body 16 and force sensor 10. For example, when not provided with the second stopper 24, the strain body 16 has needed to have external dimensions of about 50×50 mm, and thickness of about 5 mm. However, when the strain body 16 is provided with the second stopper 24 according to this embodiment, it is possible to downsize the strain body 16 and reduce the thickness thereof to such a degree that the external dimensions of the strain body 16 is about 35×35 mm, and thickness thereof is about 4 mm.

Furthermore, according to the first embodiment described above, the first stopper 14 includes the first side face 14*a* with which the inner face of the opening 13 of the movable body 12 is to be brought into contact, and second side face 14*b* having an outer diameter less than the outer diameter of the first side face 14*a* and, at the time of adjustment of the first stopper 14, the insertion section 30*a* of the shim 30 is inserted between the second side face 14*b* of the first stopper 14 and inner face of the opening 13, the insertion section 30*a* having the thickness corresponding to the distance W30 between the second side face 14*b* and inner face of the opening 13. Accordingly, the central axis of the shim 30 and central axis C14 of the first stopper 14 are coincident with each other, whereby the first stopper 14 is moved by the distance W15*a* or W15*b* of the gap. Therefore, it is possible to accurately set the distance W14 between the first side face 14*a* of the first stopper 14 and inner face of the opening 13 (FIG. 7 and FIG. 8).

Moreover, the adjustment is completed by only fitting the shim 30 in the state where the bolt 15 is loosened, and tightening the bolt 15 through the opening 33 of the shim 30. Accordingly, it is possible facilitate the adjustment work while reducing the error in the distance W14 which is the clearance to the extent possible.

Furthermore, the first side face 14*a* and second side face 14*b* of the first stopper 14 can be formed by continuously carrying out machining of these faces 14*a* and 14*b* in, for example, the same manufacturing process. Accordingly, it is easy to carry out dimensional management and inspection of the first side face 14*a* and second side face 14*b*.

Further, regarding the movable body 12, it is sufficient if only the dimension of the diameter R13 of the opening 13 is managed in the manufacture/processing thereof, and hence it is easy to carry out dimensional management and inspection thereof.

Furthermore, the shim 30 can be formed by continuously carrying out machining of the outer face and inner face of the insertion section 30*a* in, for example, the same manufacturing process. Accordingly, it is possible to improve the concentricity of the outer face and inner face of the insertion section 30*a*, and facilitate the dimensional management and inspection of the shim 30.

It should be noted that it is also possible to simultaneously manage the clearance W14 of the first stopper 14 and clearance W24 of the second stopper 24 by using all the shims 30 and 36 and tightening the bolts 15 and 25.

Second Embodiment (Example of a Case where a Member (Thermal Expansion Suppressing Member) Configured to Suppress Thermal Expansion is Provided)

Figure 10:
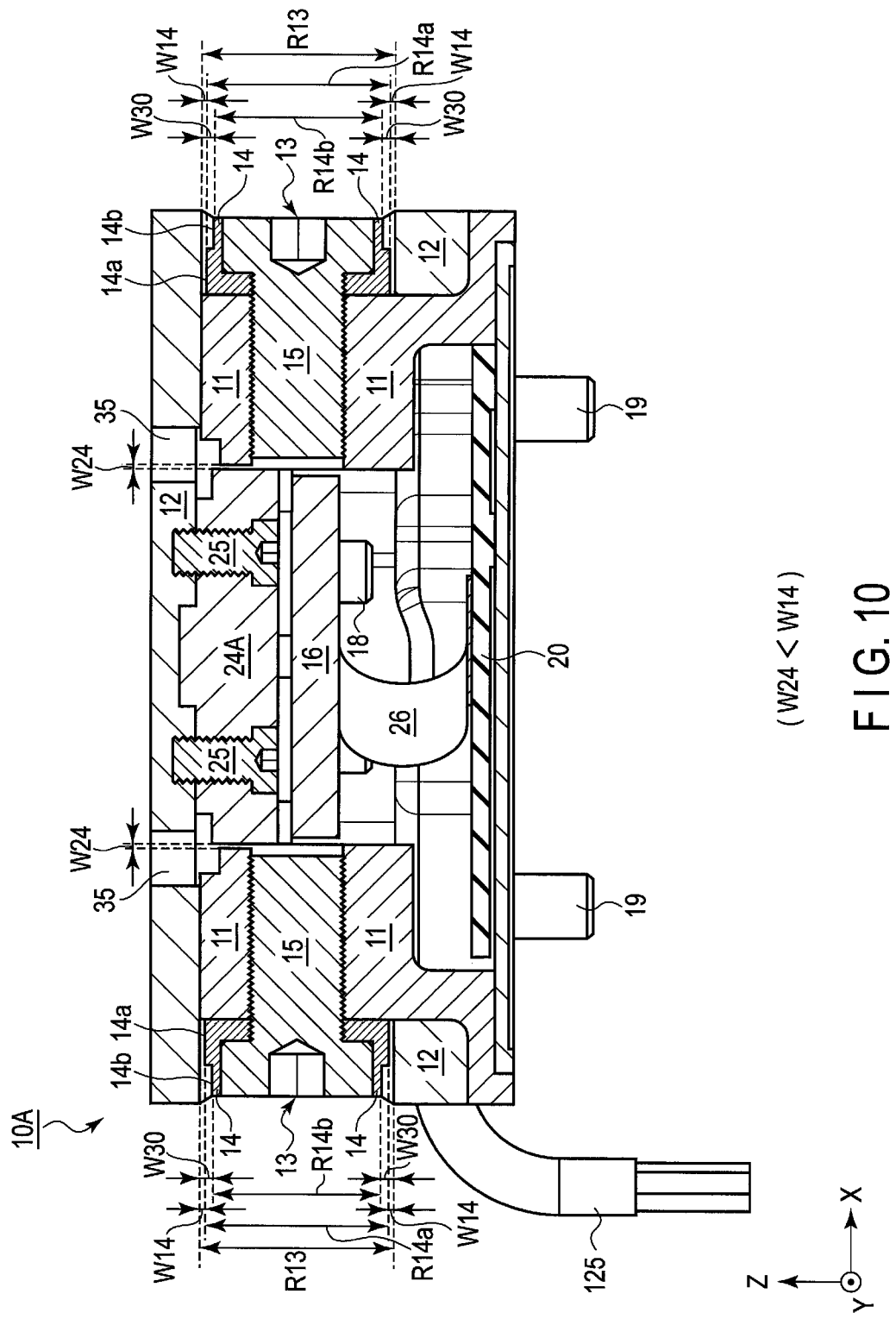
FIG. 10 is a cross-sectional view showing a force sensor according to a second embodiment.

A second embodiment relates to countermeasures against thermal expansion of a strain body 16, and relates to a strain body 16 provided with a thermal expansion suppressing member. FIG. 10 is a cross-sectional view showing a force sensor 10A according to the second embodiment.

The difference between the force sensor 10A shown in FIG. 10 differs from the first embodiment is that a second stopper 24A is formed of a material identical to the strain body 16, and second stopper 24A functions as a thermal expansion suppressing member of the strain body 16. Further, at least part of the second stopper 24A at which the second stopper 24A is fixed to the strain body 16 by means of each of the bolts 18 is in contact with the strain body 16.

FIG. 11 is a plan view showing the strain body 16 of the force sensor according to this embodiment. As shown in FIG. 11, the strain body 16 is provided with a central section 161, outer peripheral section 162 surrounding the central section 161, and four connection sections (beams) 163 connecting the central section 161 and the outer peripheral section 162 to each other. Strain sensors not shown are provided on the surfaces of the central section 161 and connection sections 163. The central section 161 is fixed to a movable body (first supporting member) 12 by means of bolts 18 respectively penetrating four holes 18a through a second stopper 24A. The outer peripheral section 162 is fixed to a main body (second supporting member) 11 by means of bolts not shown respectively penetrating four screw holes 17a. The strain body 16 is constituted of a material, for example, stainless steel (for example, SUS630) or the like which is a ferrous or alloy steel in view of fatigue characteristics, high mechanical strength, and the like.

Further, as shown in FIG. 11, the connection sections 163 and outer peripheral section 162 serving as beams of the strain body 16 can schematically be shown as springs. The spring constant (stiffness) C163 of the connection section 163 is set to a value sufficiently greater (stronger) than the spring constant C162 of the outer peripheral section 162 (C163>C162).

It should be noted that the material constituting the second stopper 24A is not limited to the material identical to the strain body 16, and may be a material of the same kind as the strain body 16 or material having a coefficient of thermal expansion similar to the strain body 16. As the material having a coefficient of thermal expansion similar to the strain body 16, for, example, a material the coefficient of thermal expansion of which differs from the strain body 16 by about ±20% is desirable, and material the coefficient of thermal expansion of which differs from the strain body 16 by about ±10% is more desirable.

Further, when the stiffness of the second stopper 24A is low, a dimensional variation of the movable body 12 resulting from a temperature variation cannot be sufficiently suppressed by the second stopper 24A, and hence the second stopper 24A is distorted, and there is a possibility of the strain body 16 being distorted. Accordingly, it is desirable that the second stopper 24A be provided with stiffness sufficiently higher than the movable body 12 and strain body 16.

Other configurations and operations are substantially identical to the first embodiment, and hence detailed descriptions of these are omitted.

[Function and Advantage]

As described above, around the strain body 16, the main body 11 and movable body 12 both serving as a case body (housing) configured to retain therein the strain body 16 are provided. The main body 11 and movable body 12 are constituted of a material such as an aluminum ally or the like in view of weight reduction. On the other hand, the strain body 16 is constituted of a material, for example, stainless steel (for example, SUS630) or the like which is a ferrous or alloy steel in view of fatigue characteristics, high mechanical strength, and the like. As described above, when the strain body 16 and case body (main body 11 and movable body 12) are constituted of materials differing from each other in coefficient of thermal expansion, the strain body 16 receives a strain concomitant with expansion/contraction of the case body by an ambient temperature variation around the case body. Accordingly, the zero point which is the reference value of the bridge circuit constituted of strain sensors provided on the surface of the strain body 16 varies, and there is a possibility of the detection accuracy being lowered. For example, when a metallic thin film resistive element such as Cr—N or the like is used as the strain sensor, the gage factor of the strain sensor is high, and hence a minute strain of the strain body 16 caused by the ambient temperature change brings about a great output change.

However, the second stopper 24A according to the second embodiment is constituted of a material identical to the strain body 16, and hence the coefficients of thermal expansion of the second stopper 24A and strain body 16 are identical to each other. Moreover, the second stopper 24A is in contact with the strain body 16 at least at part of the second stopper 24A at which the second stopper 24A is fixed to the strain body 16 by means of each of the bolts 18 (FIG. 10). Accordingly, when the ambient temperature variation is transmitted to the case body, the second stopper 24A and strain body 16 each cause thermal expansions substantially identical to each other. Accordingly, it is possible to suppress the variation in the zero point of the bridge circuit concomitant with the temperature change of the strain sensor, and maintain the measurement accuracy.

Further, the second stopper 24A is provided on the central section 161 of the strain body 16, and is configured to have a similar size to the strain body 16 (FIG. 10). Accordingly, it is possible to make downsizing and weight reduction of the second stopper 24A serving as the thermal expansion suppressing member compatible with each other.

More specifically, the spring constant (stiffness) C163 of the connection section 163 of the second stopper 24A is configured to be sufficiently higher (harder) than the spring constant C162 of the outer peripheral section 162 (C163>C162) (FIG. 11). Here, when a temperature variation occurs, a strain occurs at the central section 161 of the strain body 16 on the basis of a difference between the coefficients of thermal expansion of the movable body 12 and second stopper 24A. Although the central section 161 has high stiffness, the central section 161 is configured in such a manner that the strain is directly applied to the strain sensors provided on the central section 161.

On the other hand, in the outer peripheral section 162, although a strain occurs on the basis of a difference between the coefficients of thermal expansion of the outer peripheral section 162 and main body 11, a strain sensor provided on each connection section 163 is strained through a spring (C162) softer than the central section 161. Accordingly, the displacement of the main body 11 resulting from the thermal expansion is absorbed by the soft spring (C162) of the outer peripheral section 162 and, as a result, only a small strain corresponding to the reaction force of the soft spring (C162) occurs in the strain sensor provided on the connection section 163.

As described above, providing the second stopper 24A above the central section 161 of the strain body 16 is effective for the prevention of zero-point variation caused by thermal expansion.

Third Embodiment (Example of a Case where a Waterproof/Dustproof Structure is Provided)

Figure 12:
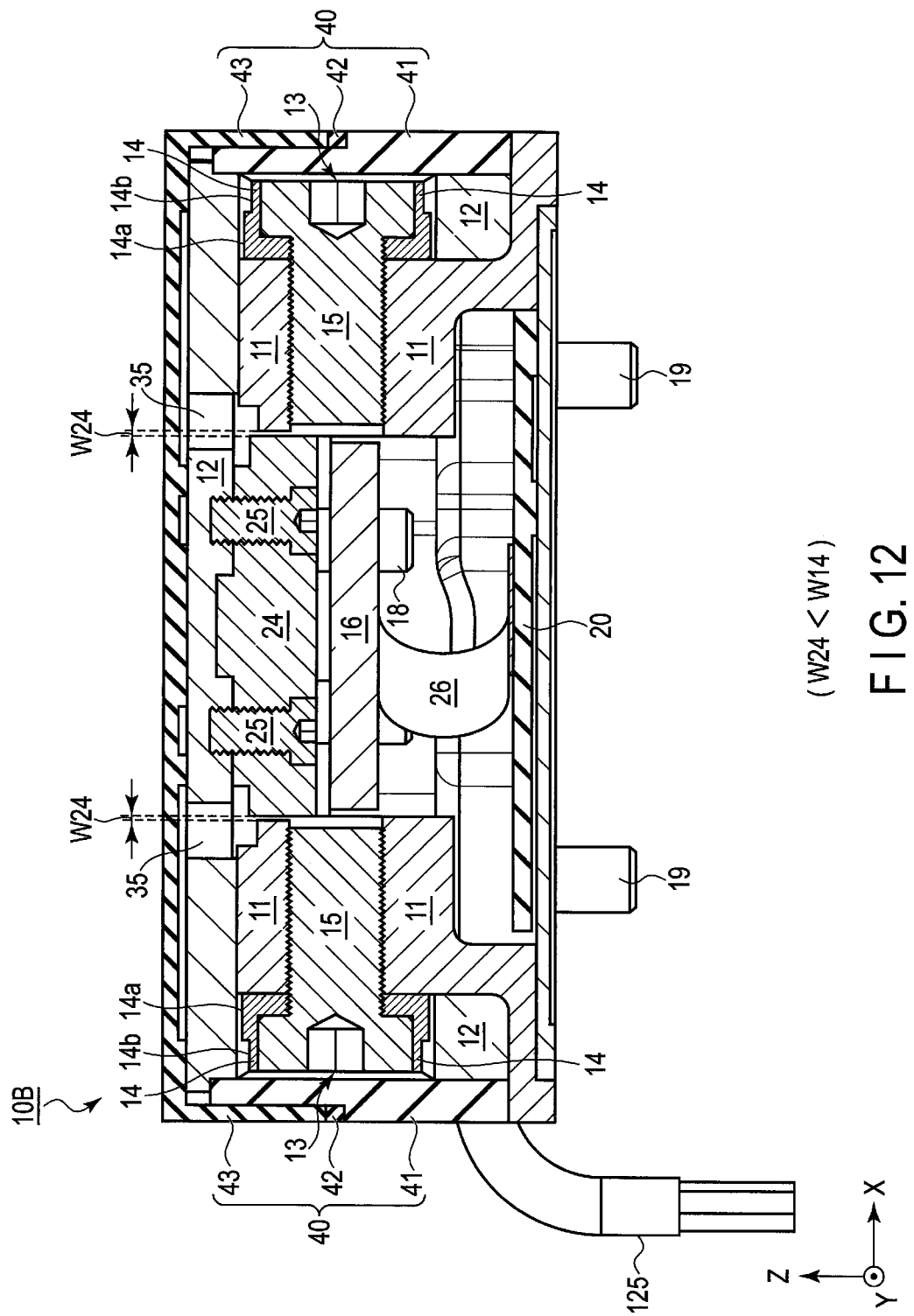
FIG. 12 is a cross-sectional view showing a force sensor according to a third embodiment.

A third embodiment relates to an example of a force sensor provided with a waterproof/dustproof structure. FIG. 12 is a cross-sectional view showing a force sensor 10B according to the third embodiment.

As shown in FIG. 12, the force sensor 10B according to the third embodiment is further provided with, unlike the first and second embodiments, a rubber member 41 (first sealing member) serving as a waterproof/dustproof member 40, foamed member (third sealing member) 42, and cover member (second sealing member) 43. The rubber member 41 covers openings 13 provided in the side face of the force sensor 10B. The cover member 43 is attached to a movable body 12, and covers a top face and side face of the movable body 12 and part of the rubber member 41. The foamed member 42 covers a gap between the main body 11, rubber member 41 and cover member 43.

The rubber member 41 is provided in such a manner as to cover the openings 13 in order to seal up the first stopper 14, and is constituted of a rubber material. The material constituting the rubber member 41 may be, for example, a foamed material, and closed porous material is more desirable.

The foamed member 42 is constituted of a foamed material having stiffness sufficiently less (springiness sufficiently less) than the stiffness of the strain body 16 in order that the movement of the movable body 12 and cover member 43 may not be obstructed. In this embodiment, the foamed member 42 is constituted of a material which is a closed porous material and is a rubber-based material. Further, the foamed member 42 is configured to cover the movable part (gap) which is the boundary between the main body 11 and movable body 12, and hence it is desirable that the foamed member 42 be constituted of a material having such a degree of stiffness that the movement of the movable body 12 is not obstructed.

In this embodiment, the ratio between the strain body 16 and foamed member 42 in stiffness is configured in such a manner as to be approximately 500:1. It is desirable that the ratio between the strain body 16 and foamed member 42 in stiffness be 100:1 or more, and it is more desirable that the ratio be 1000:1 or more. The stiffness in this case implies difficulty in deformation based on, for example, Young's modulus, shape or the like of the material.

The cover member 43 is provided on the outer circumference of the movable body 12 and prevents liquid or dust from entering the inside through bolt holes or the like for fixing bolts provided in the top face or the like of the movable body 12. The material for the cover member 43 is not limited to a metallic material, and may be a resin material.

Other configurations and operations are substantially identical to the first embodiment, and hence detailed descriptions of these are omitted.

[Assembling Process]

Figure 13:
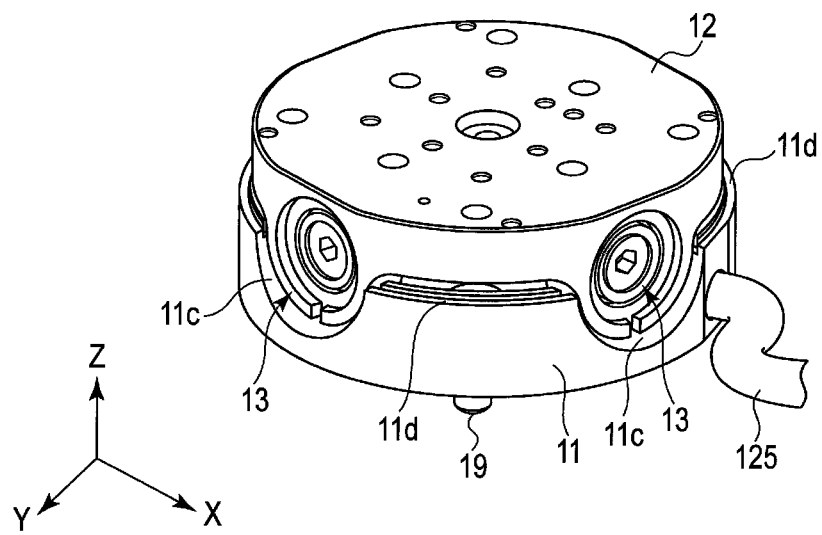
FIG. 13 is a perspective view for explaining an assembling process of a waterproof/dustproof structure of the force sensor according to the third embodiment.
Figure 14:
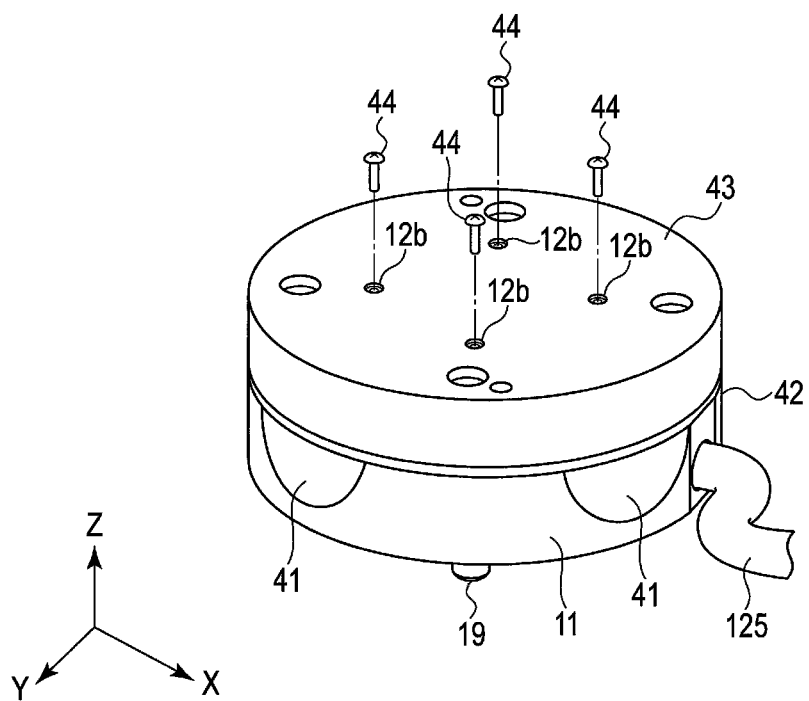
FIG. 14 is a perspective view for explaining the assembling process of the waterproof/dustproof structure of the force sensor according to the third embodiment.

FIG. 13 and FIG. 14 are perspective views for explaining an assembling process of a waterproof/dustproof member 40 of the force sensor 10B according to the third embodiment.

As shown in FIG. 13, first, the movable body 12 to which the second stopper 24 is fixed is fitted to the main body 11. In this state, the predetermined distance W14 or the like is provided between the first stopper 14 inside the opening 13 in the side face of the force sensor 10B and movable body 12, and hence the force sensor 10B is not completely sealed up yet. In this embodiment, on the side face of the main body 11, fitting sections 11c and 11d outwardly protruding from the side face for the purpose of respectively fitting the rubber member 41 and foamed member 42 into them are provided.

As shown in FIG. 14, subsequently, the rubber member 41 is fitted into the fitting section 11c of the main body 11, whereby the opening 13 of the main body 11 is covered. Subsequently, the approximately ring-shaped foamed member 42 is fitted into the fitting section 11d functioning as a movable section between the main body 11 and movable body 12, whereby the rubber member 41 is held.

Furthermore, the cover member 43 is attached to the movable body 12, whereby the top face and side face of the movable body 12 are covered with the cover member 43. The screws 44 inserted into the screw holes 12b are screwed into the movable body 12, whereby the cover member 43 is fixed to the movable body 12. At this time, the pressure by which the cover member 43 presses the foamed member 42 is adjusted. More specifically, the thickness of the foamed member 42 is reduced to about 20% to 30% of the thickness thereof before the cover member 43 is attached to the movable body 12.

By the process described above, the rubber member 41, foamed member 42, and cover member 43 all serving as the waterproof/dustproof member 40 of the force sensor 10B are assembled.

[Function and Advantage]

According to the configuration and operation of the force sensor 10B according to the third embodiment, at least an advantage identical to the first and second embodiments can be obtained.

Furthermore, the force sensor 10B according to the third embodiment is provided with the rubber member 41 serving as the waterproof/dustproof member 40, foamed member 42, and cover member 43, the opening 13 of the main body 11 is covered with the rubber member 41, the movable section which is the gap between the main body 11 and movable body 12 is covered with the foamed member 42, and the top face and side face of the movable body 12 are covered with the cover member 43 (FIG. 12).

According to the configuration described above, it is possible to prevent liquid and dust from entering the inside from outside the force sensor 10B, and improve the reliability of the force sensor 10B while securing the accuracy of the strain sensors provided on the strain body 16.

Accordingly, for example, when the force sensor 10B is applied to a robot arm or the like, even under such an inferior environment that liquid such as oil, water or the like is used and dust scatters therein, it is possible to securely prevent liquid and dust from entering the inside through the gap between the main body 11 and movable body 12.

Moreover, the force sensor 10B is provided with the openings 13 and first stoppers 14 in the side face thereof, and hence the circumferential shape thereof is complicated. However, by combining the rubber member 41, foamed member 42, and cover member 43 with each other, it is possible to attach three rubber member 41, foamed member 42, and cover member 43 to the force sensor 10B by using only the screws 44 (FIG. 13 and FIG. 14). Accordingly, by using the simple structure, it is possible to obtain a sufficient waterproof/dustproof function, and also reduce the manufacturing cost.

Modification Example 1 (Example in which the Planar Shape of a Second Stopper is Cross-Shaped)

Figure 15A:
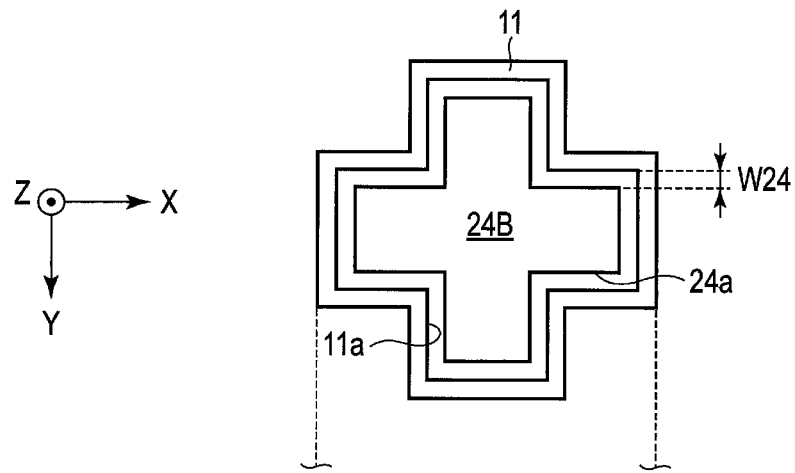
FIG. 15A is a plan view showing a relationship between a second stopper and main body according to a modification example 1.
Figure 15B:
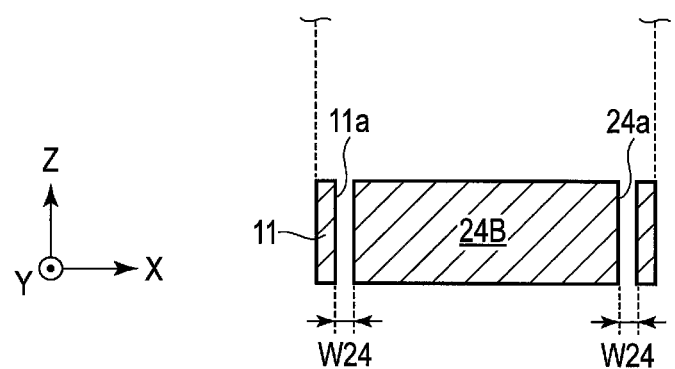
FIG. 15B is a cross-sectional view of FIG. 15A.

FIG. 15A is a plan view schematically showing a relationship between a second stopper 24B and main body 11 according to a modification example 1, and FIG. 15B shows a cross-sectional view of FIG. 15A.

As shown in FIG. 15A, the planar shape of the second stopper 24B is cross-shaped. The shape of the main body 11 which is the force-receiving-side member of the second stopper 24B is also configured to be cross-shaped correspondingly to the second stopper 24B.

According to the configuration described above, when torque around the Z-axis is applied to the force sensor, the outer circumferential surface 24a of the second stopper 24B and inner circumferential surface 11a are brought into contact with each other. Accordingly, the second stopper 24B can obtain a protective function against torque around the Z-axis in addition to the protective function against each of the force Fx and force Fy in the X-, and Y-axis directions without adding new members or parts.

Modification Example 2 (Example in which the Cross-Sectional Shape of a Second Stopper Includes a Convex Section)

FIG. 16A is a plan view schematically showing a second stopper 24C and main body 11 according to a modification example 2, and FIG. 16B is a cross-sectional view of FIG. 16A.

As shown in FIG. 16B, the second stopper 24C includes a protruding section 124 protruding in the X-axis direction. The inner circumferential surface of the main body 11 also includes a protruding section 111 protruding in the X-axis direction. In the Z-axis direction, a distance W24 is provided between the side face (underside) 24b of the protruding section 124 of the second stopper 24C and side face (top face) 11c of the protruding section 111 of the main body 11.

As described above, between the side face 24b of the second stopper 24C and side face 11c of the main body 11, the distance W24 is provided as a clearance in the Z-axis direction, whereby the second stopper 24C can obtain the protective function against the force Fz in the Z-axis direction and torque Mx and torque My around the X-, and Y-axis directions. In this case, the first stopper 14 can obtain the protective function against each of the other force and torque concerning the three axes (Fx, Fy, and Mz). Accordingly, the modification example 2 can further improve the protective function of the strain body.

Modification Example 3 (Example in which the Main Body is Provided with a Member Having a Coefficient of Thermal Expansion Identical to the Strain Body)

Figure 17:
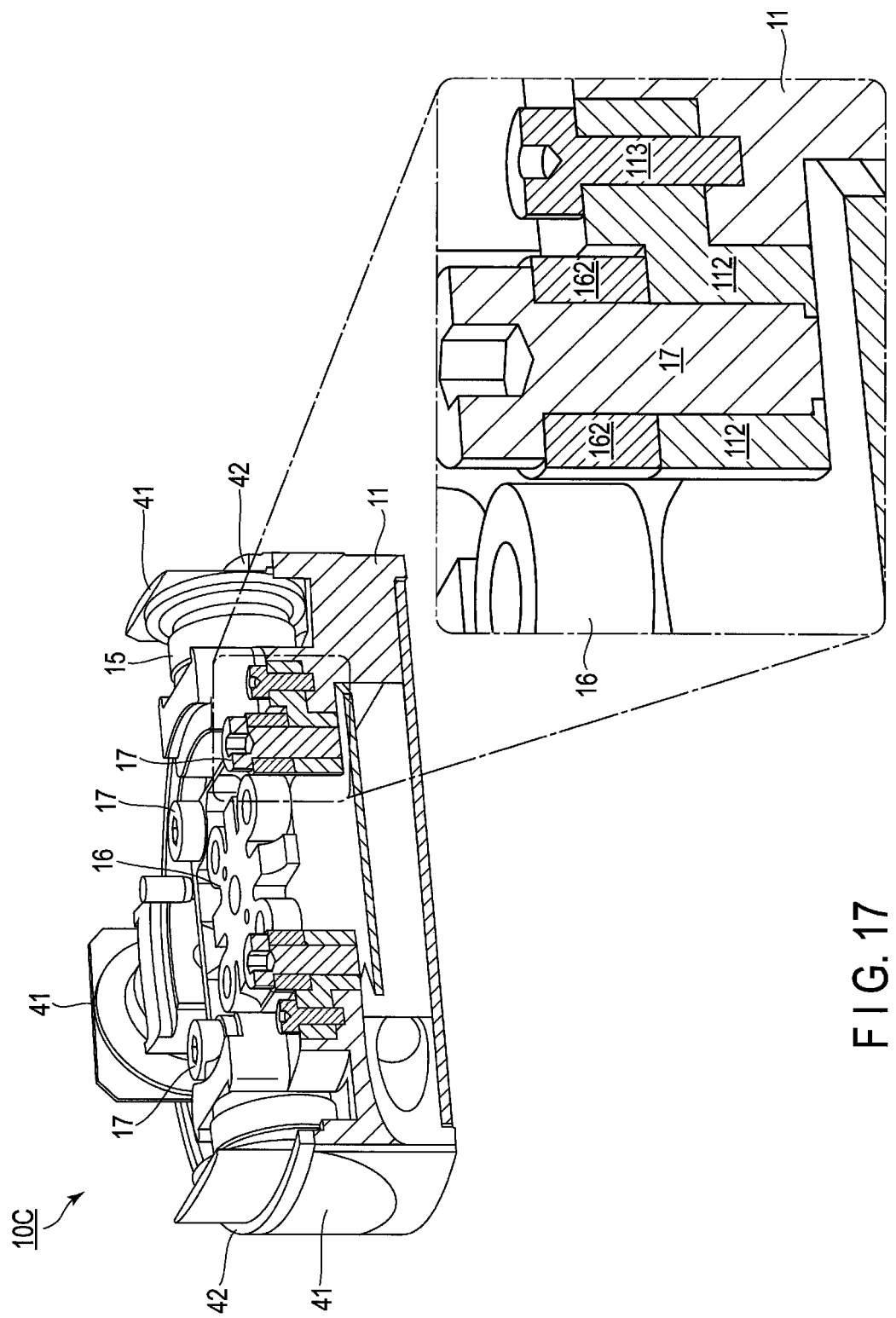
FIG. 17 is a partially cutaway perspective view shown for explaining a thermal expansion member according to a modification example 3.

FIG. 17 is a partially cutaway perspective view shown for explaining a thermal expansion member according to a modification example 3. It should be noted that in the force sensor shown in FIG. 17, part of the configuration is omitted for convenience of explanation.

As shown in FIG. 17 in the partially enlarged view thereof, a thermal expansion suppressing member 112 is further provided between the main body 11 and strain body 16. The thermal expansion suppressing member 112 has a coefficient of thermal expansion identical to the strain body 16. The thermal expansion suppressing member 112 is in contact with the outer peripheral section 162 of the strain body 16 and inside of the main body 11, is fastened to the outer peripheral section 162 of the strain body 16 with a bolt 17 and is fastened to the main body 11 with a bolt 113.

According to the configuration described above, in addition to the second stopper 24A functioning as the thermal expansion suppressing member provided on the central section 161 of the strain body 16, the thermal expansion suppressing members 112 are provided also in contact with the outer peripheral section 162 of the strain body 16, whereby it is possible to suppress the variation in the zero point of the bridge circuit concomitant with the temperature change of the strain sensor resulting from thermal expansion.

Other Modification Examples

The present invention is not limited to the disclosures of the first to third embodiments described above and modification examples 1 to 3, and can of course be variously modified as the need arises.

For example, in each of the first and second embodiments, although the case where the second stopper 24 or 24A is a member separate from the movable body 12 has been described, the second stopper 24 or 24A to 24C and movable body 12 may also be formed integral with each other as an integral structure constituted of one member. In this case, in order to suppress thermal expansion, it is desirable that the movable body 12 to be made integral with the second stopper 24 or 24A to 24C be constituted of a material identical to the strain body or material having a coefficient of thermal expansion approximately equal to the strain body 16.

Further, carrying out of the inspection using the shim 30 is not limited to the time of shipment, the inspection may be carried out at the time of, for example, maintenance or the like after the force sensor 10 or 10A to 10C is operated for a certain period of time.

Furthermore, the rubber member 41 and foamed member 42 may also be formed of the same material into one integral body. In this case, it is desirable that the material for these members be the rubber material or closed porous material. It is desirable that the material for these members be a material having stiffness sufficiently lower than the stiffness of the strain body 16.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A force sensor comprising:
a cylindrical main body;
a cylindrical movable body movable with respect to the cylindrical main body and including at least three circular openings at an outer circumference of the cylindrical movable body;
a strain body fixed to the cylindrical main body and the cylindrical movable body at a central internal part of the force sensor, wherein the strain body is deformable according to the movement of the cylindrical movable body;
strain sensors provided on the strain body;
a first stopper arranged inside each of the at least three circular openings at the cylindrical movable body, wherein the first stopper includes a first outer circumferential surface including a first outer diameter less than a diameter of the circular opening;
a first fixing member configured to fix the first stopper to the cylindrical main body; and
sealing members configured to cover at least the at three circular openings and a movable part defined between the cylindrical main body and the cylindrical movable body.

2. The force sensor of claim 1, wherein the sealing members include:
a first sealing member configured to seal each of the at least three circular openings, a second sealing member configured to seal the cylindrical movable body, and a third sealing member configured to seal at least a gap defined between the cylindrical main body and the second sealing member.

3. The force sensor of claim 2, wherein
the first sealing member is a rubber member,
the second sealing member is constituted of a metallic material or a resin material, and
the third sealing member is constituted of a foamed material.

4. The force sensor of claim 1, further comprising a cylindrical second stopper including a second outer circumferential surface with a second outer diameter, wherein the cylindrical second stopper is arranged inside of the main body and separated from a first inner circumferential surface of the cylindrical main body by a first distance, wherein the first distance is a distance between the first inner circumferential surface of the cylindrical main body and the second outer circumferential surface of the second stopper, and wherein the second outer diameter less than a diameter of the first inner circumferential surface.

5. The force sensor of claim 4, wherein
the first distance is less than a second distance between the first outer circumferential surface of the first stopper and an inner surface of the opening.

6. The force sensor of claim 4, wherein
the main body includes a second inner circumferential surface forming a diameter greater than the diameter formed by the first inner circumferential surface.

7. The force sensor of claim 6, further comprising a first jig for adjustment to be inserted between the outer circumferential surface of the second stopper and the second inner circumferential surface of the main body.

8. The force sensor of claim 4, further comprising:
second fixing members configured to fix the second stopper to the cylindrical movable body; and
third fixing members configured to fix the strain body to the second stopper.

9. The force sensor of claim 1, wherein
the first stopper includes a second side face of a third outer diameter less than the first outer diameter.

10. The force sensor of claim 9, further comprising a second jig for adjustment to be inserted between the inner surface of the opening and the second side face.

11. The force sensor of claim 1, wherein the first fixing member is a bolt.

12. The force sensor of claim 1, wherein the cylindrical main body, the cylindrical movable body, and the strain body having the strain sensors are coaxially arranged about a common axis.

* * * * *